United States Patent
Kang

(10) Patent No.: US 9,620,295 B2
(45) Date of Patent: Apr. 11, 2017

(54) DYE-SENSITIZED SOLAR CELL AND METHOD FOR MANUFACTURING SAME

(71) Applicants: LG CHEM, LTD., Seoul (KR); Soo Hee Jung, Daejeon (KR)

(72) Inventor: Tae-Sik Kang, Beavercreek, OH (US)

(73) Assignee: DENTONS US LLP, Seoul (KR)

( * ) Notice: Subject to any disclaimer, the term of this patent is extended or adjusted under 35 U.S.C. 154(b) by 29 days.

(21) Appl. No.: 14/398,646

(22) PCT Filed: May 8, 2013

(86) PCT No.: PCT/KR2013/004032
§ 371 (c)(1),
(2) Date: Nov. 3, 2014

(87) PCT Pub. No.: WO2013/169004
PCT Pub. Date: Nov. 14, 2013

(65) Prior Publication Data
US 2015/0090332 A1    Apr. 2, 2015

Related U.S. Application Data

(60) Provisional application No. 61/644,278, filed on May 8, 2012.

(51) Int. Cl.
*H01G 9/20* (2006.01)
*H01L 51/44* (2006.01)
(Continued)

(52) U.S. Cl.
CPC ........... *H01G 9/2022* (2013.01); *H01G 9/204* (2013.01); *H01G 9/2031* (2013.01);
(Continued)

(58) Field of Classification Search
CPC .... H01G 9/2031; H01G 9/2036; H01G 9/204; H01G 9/2059; H01G 9/2072;
(Continued)

(56) References Cited

U.S. PATENT DOCUMENTS

2004/0061109 A1* 4/2004 Nakamura ........... H01G 9/2031
257/43
2006/0289056 A1   12/2006 Gondo et al.
(Continued)

FOREIGN PATENT DOCUMENTS

CN        1846327 A    10/2006
CN      102365695 A     2/2012
(Continued)

OTHER PUBLICATIONS

"Tandem dye-sensitized solar cell for improved power conversion efficiencies", M. Durr et al., Applied Physics Letters, vol. 84, No. 17, pp. 3397-3399, Apr. 26, 2004.
(Continued)

*Primary Examiner* — Dujuan Horton
(74) *Attorney, Agent, or Firm* — Dentons US LLP

(57) ABSTRACT

The present invention relates to a dye-sensitized solar cell and a fabrication method thereof. The dye-sensitized solar cell according to the present invention comprises: a transparent substrate; a porous semiconductor layer provided on the transparent substrate and comprising a dye sensitizer; a current collecting electrode provided on the porous semiconductor layer and deposited such that a structure having at least one through-hole on the porous semiconductor layer is formed; a catalyst electrode; and an electrolyte material provided between the transparent substrate and the catalyst electrode.

34 Claims, 9 Drawing Sheets

(51) Int. Cl.
*H01L 51/48* (2006.01)
*H01L 51/00* (2006.01)

(52) U.S. Cl.
CPC ......... *H01G 9/2036* (2013.01); *H01G 9/2077* (2013.01); *H01G 9/2059* (2013.01); *H01G 9/2072* (2013.01); *H01L 51/0086* (2013.01); *Y02E 10/542* (2013.01); *Y02P 70/521* (2015.11)

(58) Field of Classification Search
CPC .. H01G 9/2077; H01G 9/2013; H01G 9/2022; Y02E 10/542
USPC ............................................ 136/263; 438/82
See application file for complete search history.

(56) References Cited

U.S. PATENT DOCUMENTS

| | | | |
|---|---|---|---|
| 2007/0056628 A1* | 3/2007 | Park | B82Y 10/00 136/263 |
| 2011/0284063 A1 | 11/2011 | Yu et al. | |
| 2012/0017974 A1 | 1/2012 | Hayashi et al. | |
| 2012/0048357 A1 | 3/2012 | Hayase et al. | |
| 2012/0115271 A1 | 5/2012 | Holliman et al. | |
| 2013/0161555 A1 | 6/2013 | Hanaya et al. | |

FOREIGN PATENT DOCUMENTS

| | | |
|---|---|---|
| JP | 2004-363069 A | 12/2004 |
| JP | 2005-317453 A | 11/2005 |
| JP | 2007-200559 A | 8/2007 |
| JP | 2007-242544 A | 9/2007 |
| JP | 2008287893 A | 11/2008 |
| JP | 2009-245750 A | 10/2009 |
| JP | 2010021102 A | 1/2010 |
| KR | 1020110098246 A | 9/2011 |
| KR | 1020110098246 A | 12/2011 |
| TW | 201145527 A | 12/2011 |
| WO | 2009/075101 A1 | 6/2009 |
| WO | 2010098088 A1 | 9/2010 |
| WO | 2010/130476 A1 | 11/2010 |
| WO | 2012/036010 A1 | 3/2012 |
| WO | 2012031357 A1 | 3/2012 |

OTHER PUBLICATIONS

Miao, Qing-qing, et al., "Tandem Dye—sensitized Solar Cells," Journal of Functional Materials and Devices, vol. 17, No. 6, Mar. 2012, pp. 611-619.

* cited by examiner

Solar Light

Solar Light

DYE-SENSITIZED SOLAR CELL AND METHOD FOR MANUFACTURING SAME

This application is a 35 USC §371 National Stage entry of International Application No. PCT/KR2013/004032, filed on May 8, 2013, and claims priority to U.S. Provisional application No. 61/644,278, filed May 8, 2012, which are hereby incorporated by reference in their entirety as if fully set forth herein.

TECHNICAL FIELD

The present specification relates to a dye-sensitized solar cell and a fabrication method thereof.

BACKGROUND ART

Crystalline silicon solar cells have been widely known as a device for directly converting light energy into electric energy. The crystalline silicon solar cells are used as an independent power source, and as a power source for use in a vehicle. The crystalline silicon solar cells are made usually of silicon single crystals or amorphous silicon. However, enormous amounts of energy is required to produce silicon single crystals or amorphous silicon, and in order to recover energy consumed for fabricating the solar cells, the solar cells needs to generate electric power continuously for nearly a ten-year long period.

On the contrary, dye-sensitized solar cells have been proposed as an inexpensive solar cell. The dye-sensitized solar cells have been expected to serve as the next-generation solar cell due to a simple fabrication method and a reduction in material costs. As illustrated in the following FIG. 16, for example, a dye-sensitized solar cell in the related art comprises a transparent conductive electrode 503, a porous semiconductor layer 102 comprising a dye sensitizer 102*a* supported therein, a counter electrode 505, and an electrolyte material 107 provided between the transparent conductive electrode 503 and the counter electrode 505.

DETAILED DESCRIPTION OF THE INVENTION

Technical Problem

The present invention has been made in an effort to provide a dye-sensitized solar cell having excellent power conversion efficiency and a fabrication method thereof.

Technical Solution

The present invention provides a dye-sensitized solar cell comprising:

a transparent substrate;

a porous semiconductor layer provided on the transparent substrate and comprising a dye sensitizer;

a current collecting electrode provided on the porous semiconductor layer and deposited such that a structure having at least one through-hole on the porous semiconductor layer is formed;

a catalyst electrode; and an electrolyte material provided between the transparent substrate and the catalyst electrode.

Further, the present invention provides a dye-sensitized solar cell comprising:

a transparent substrate;

a first porous semiconductor layer provided on the transparent substrate and comprising a first dye sensitizer;

a current collecting electrode provided on the first porous semiconductor layer;

a second porous semiconductor layer provided on the current collecting electrode and comprising a second dye sensitizer;

a catalyst electrode; and an electrolyte material provided between the transparent substrate and the catalyst electrode.

In addition, the present invention provides a method for fabricating a dye-sensitized solar cell, the method comprising:

preparing a transparent substrate;

forming a porous semiconductor layer on the transparent substrate;

depositing a current collecting electrode on the porous semiconductor layer such that a structure having at least one through-hole on the porous semiconductor layer is formed;

introducing a dye sensitizer into the porous semiconductor layer;

forming a catalyst electrode; and introducing an electrolyte material between the transparent substrate and the catalyst electrode.

Furthermore, the present invention provides a method for fabricating a dye-sensitized solar cell, the method comprising:

preparing a transparent substrate;

forming a first porous semiconductor layer on the transparent substrate;

depositing a first current collecting electrode on the first porous semiconductor layer;

introducing a dye sensitizer into the porous semiconductor layer;

forming a second porous semiconductor layer on the first current collecting electrode;

introducing a second dye sensitizer into the second porous semiconductor layer;

forming a catalyst electrode; and introducing an electrolyte material between the transparent substrate and the catalyst electrode.

Advantageous Effects

The dye-sensitized solar cell according to the present invention may enhance the collection of photogenerated electrons from a porous semiconductor layer by improving the contact of the porous semiconductor layer with a current collecting electrode, thereby improving the power conversion efficiency thereof. Further, the method for fabricating a dye-sensitized solar cell according to the present invention may be easily applied to a dye-sensitized solar cell comprising a plurality of semiconductor layers.

BRIEF DESCRIPTION OF DRAWINGS

FIG. 4 is a view schematically illustrating a current collecting electrode formed on the porous semiconductor layer.

EXPLANATION OF SYMBOLS FOR THE MAJOR PARTS OF THE DRAWINGS

Figure 1:
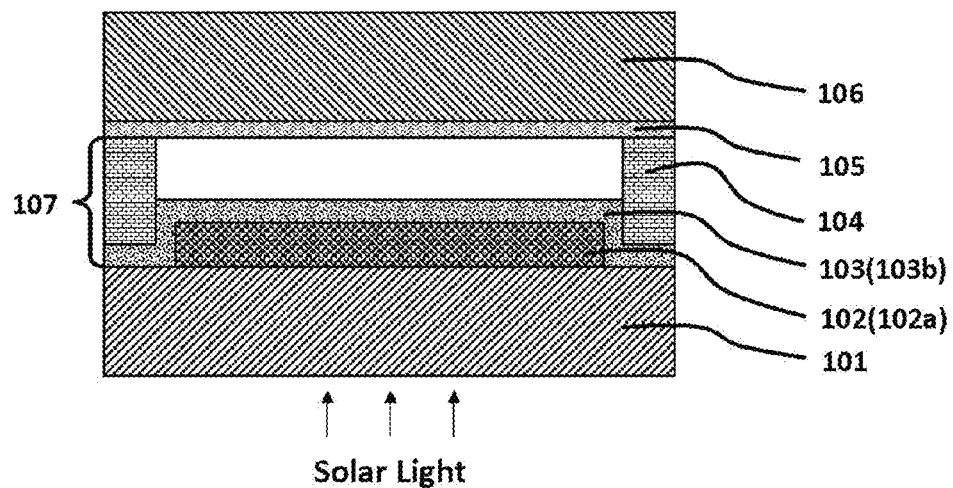
FIG. 1 is a view schematically illustrating a dye-sensitized solar cell according to a first exemplary embodiment of the present invention.

003: Transparent current collecting electrode
101: Transparent substrate
102: Porous semiconductor layer
202: Second porous semiconductor layer
302: Third porous semiconductor layer
102a, 202a, 302a: Dye sensitizer
103: Current collecting electrode
203: Second current collecting electrode
303: Third current collecting electrode
103b, 203b, 303b: Through-hole
104: Sealing spacer
104: Internal spacer
105: Catalyst electrode
106: Second substrate
107: Electrolyte material
503: Transparent conductive electrode
505: Counter electrode

BEST MODE

Hereinafter, preferred exemplary embodiments of the present invention will be described in detail with reference to the accompanying drawings.

FIG. 1 is a view schematically illustrating a dye-sensitized solar cell according to a first exemplary embodiment of the present invention. The dye-sensitized solar cell according to the first exemplary embodiment comprises a transparent substrate 101, a porous semiconductor layer 102 comprising a dye sensitizer 102a, a current collecting electrode 103 provided on the porous semiconductor layer 102 and deposited such that a structure having at least one through-hole 103b on the porous semiconductor layer 102 is formed, a sealing spacer 104, a catalyst electrode 105, a second substrate 106, and an electrolyte material 107 comprised between the transparent substrate 101 and the catalyst electrode 105.

The transparent substrate 101 may be a glass substrate, a plastic substrate, a ceramic substrate, and the like. Preferably, the transparent substrate 101 has a light transmittance of at least 10% or more. The thickness of the transparent substrate is not particularly limited as long as the transparent substrate has appropriate strength and transparency which are permitted for the solar cell. Examples of the glass comprise soda glass, borosilicate glass, aluminosilicate glass, aluminoborosilicate glass, silica glass, soda lime glass, and the like. Examples of the plastic substrate comprise polyester sheet such as polyethylene terephthalate and polyethylene naphthalate, and sheet such as polyphenylene sulfide, polycarbonate, polysulfone, and polyethylidene norbornene. Examples of the ceramic comprise high-purity alumina, and the like. Among the examples of the transparent substrate, the glass substrate is preferred due to stability and operability.

Before forming the porous semiconductor layer 102 on the transparent substrate 101, it is possible to perform pre-treatments that reinforce bonding strength, such as semiconductor layer material pre-treatment using a semiconductor material precursor solution, plasma treatment, ozone treatment, and chemical treatment. By the result of the semiconductor material pre-treatment, a pre-treatment layer (semiconductor thin film) is formed on the transparent substrate 101. For example, it is preferred that the thickness of the pre-treatment layer is 0.1 nm to 50 nm, particularly 0.2 nm to 25 nm.

The porous semiconductor layer 102 is formed on the transparent substrate 101 or the pre-treatment layer. The porous semiconductor layer may comprise a semiconductor material which is generally used in photoelectric conversion. Examples of the semiconductor material for the pre-treatment and the porous semiconductor layer 102 comprise titanium oxide, zinc oxide, tin oxide, niobium oxide, zirconium oxide, cerium oxide, tungsten oxide, silicon oxide, aluminum oxide, nickel oxide, tantalum oxide, barium titanate, strontium titanate, calcium titanate, zinc sulfide, lead sulfide, bismuth sulfide, cadmium sulfide, $CuAlO_2$, $SrCu_2O_2$, and the like. These materials may be used either alone or in combination thereof. The porous semiconductor layer may have a form of particle, rod, tube, wire, needle, film, or combination thereof.

Among the aforementioned examples of the semiconductor material, titanium oxide is preferred due to stability and safety. Examples of the titanium oxide comprise anatase type titanium oxide, rutile type titanium oxide, amorphous titanium oxide, metatitanic acid, orthotitanic acid, titanium hydroxide, hydrated titanium oxide, and the like.

The fabrication method of the porous semiconductor layer 102 is not particularly limited. For example, the porous semiconductor layer 102 may be fabricated by applying a paste comprising a semiconductor material having a form of particle, rod, tube, wire, or needle on the transparent substrate 101, and then sintering the paste. The application process of the paste is also not particularly limited, and it is possible to apply a screen printing process, a doctor blade process, a squeegee process, a spin-coat process, a spray coat process, an inkjet printing process, a gravure coat process, a chemical vapor deposition (CVD) method, a metal-organic chemical vapor deposition (MOCVD) method, a physical vapor deposition (PVD) method, a deposition method, a sputtering method, a sol-gel method, and the like. The porous semiconductor layer 102 may also be formed by transferring an alignment layer onto the transparent substrate 101 with a semiconductor material having a form of rod, tube, wire, or needle.

Figure 2:
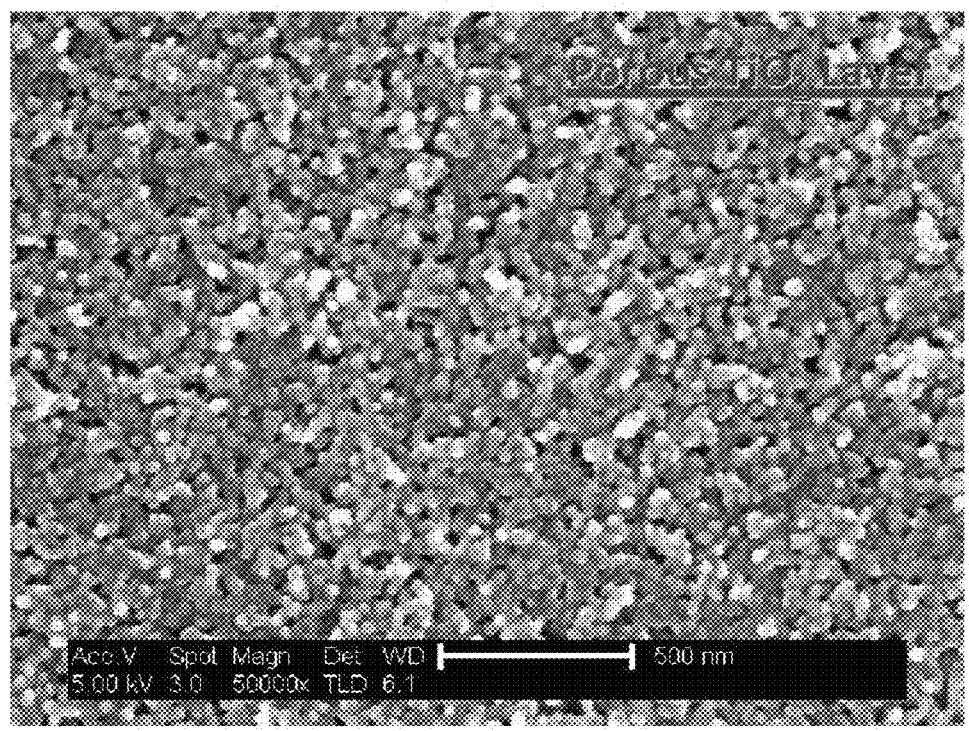
FIG. 2 is a view illustrating an SEM photograph of the upper portion of a porous semiconductor layer ($TiO_2$).

It is preferred that an average particle diameter of semiconductor particles used to form the porous semiconductor layer 102 ranges, for example, from 1 nm to 400 nm, particularly from 5 nm to 100 nm. Here, the particle diameter is determined by an SEM photograph after the porous semiconductor layer 102 is formed on the transparent substrate 101, as illustrated in the following FIG. 2.

The thickness of the porous semiconductor layer 102 is not particularly limited, and may be controlled to 0.1 μm to 100 μm, particularly 1 μm to 75 μm. In addition, it is preferred that the porous semiconductor layer 102 is subjected to heat treatment in order to remove a solvent and organic materials and increase the strength of the porous semiconductor layer 102 and adhesion between the porous semiconductor layer 102 and the transparent substrate 101. The temperature and time of the heat treatment are not particularly limited. It is preferred that the heat treatment temperature is controlled to 30° C. to 700° C., particularly 70° C. to 600° C., and that the heat treatment time is controlled to 5 minutes to 10 hours, particularly 10 minutes to 6 hours.

The current collecting electrode 103 is coated on the porous semiconductor layer 102 in order to collect electrons from the porous semiconductor layer 102 and release electrons to the outside of the solar cell. The material for the current collecting electrode 103 is not particularly limited, and a metal, a conductive oxide, a carbon material, a conductive polymer, and the like may be applied. Examples of the metal comprise titanium, nickel, platinum, gold, silver, copper, aluminum, tungsten, rhodium, indium, and the like. Examples of the conductive oxide comprise tin oxide, fluorine-doped tin oxide (FTO), indium oxide, tin-doped indium oxide (ITO), zinc oxide, and the like. Examples of the carbon material comprise carbon nanotubes, graphene, carbon black, and the like. Examples of the conductive polymer comprise poly(3,4-ethylenedioxythiophene):polystyrene sulfonate (PEDOT-PSS), polypyrrole, polyaniline, poly-3,4-ethylenedioxythiophene (poly-EDT), and the like. These materials may be used either alone or in combination thereof. The material is more preferably a conductive metal.

Figure 3:
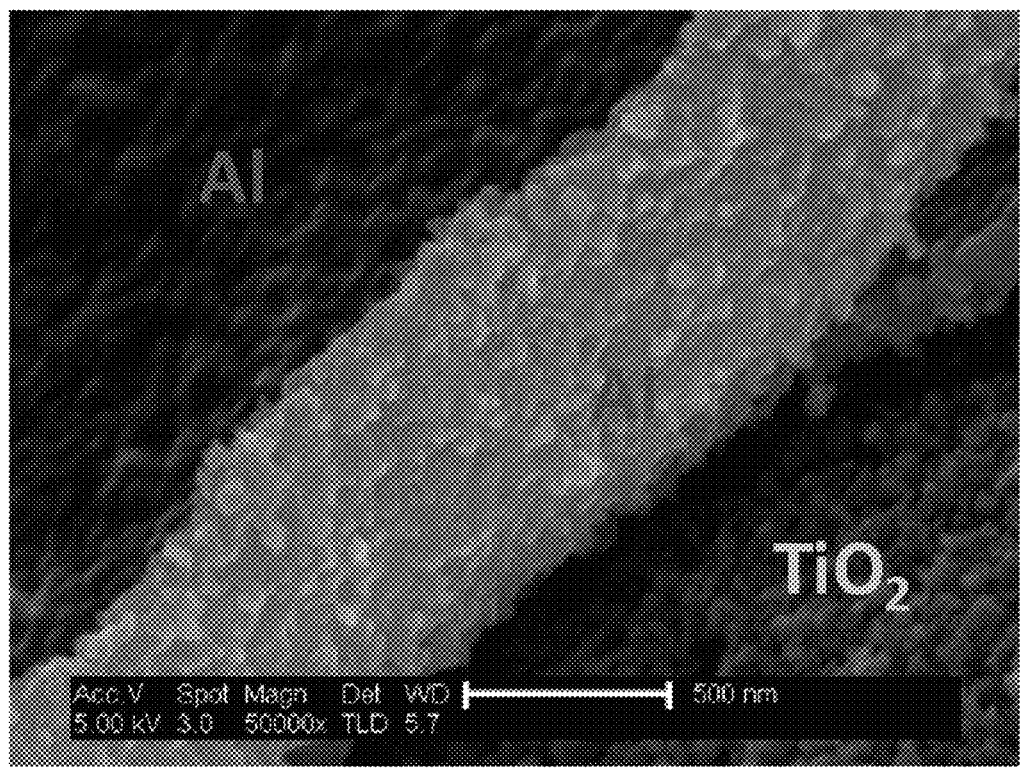
FIG. 3 is a view illustrating an SEM photograph of a slanted side of a current collecting electrode which is partially peeled-off from the porous semiconductor layer.

The current collecting electrode 103 is coated on the porous semiconductor layer 102 by a deposition method. As illustrated in the following FIG. 3, a part or whole of the current collecting electrode 103 may be embedded in the porous semiconductor layer 102. The current collecting electrode 103 may be formed by depositing a conductive material such as a metal, a conductive oxide, a carbon material, and a conductive polymer on the porous semiconductor layer 102 by physical vapor deposition such as thermal metal evaporation, electron beam evaporation, RF sputtering, magnetron sputtering, atomic layer deposition, arc vapor deposition, and ion beam assisted deposition, or a chemical vapor deposition process such as CVD, MOCVD, and plasma-enhanced chemical vapor deposition (PECVD). The deposition process is controlled such that a porous structure having at least one through-hole is formed on the porous semiconductor layer. In order to obtain good conductivity throughout the entire surface of the current collecting electrode, the current collecting electrode may have a porous structure comprising a sheet form and through-holes. It is preferred that the porous structure of the current collecting electrode 103 is simply formed by a deposition method instead of other materials such as a pore forming auxiliary agent.

Figure 4:
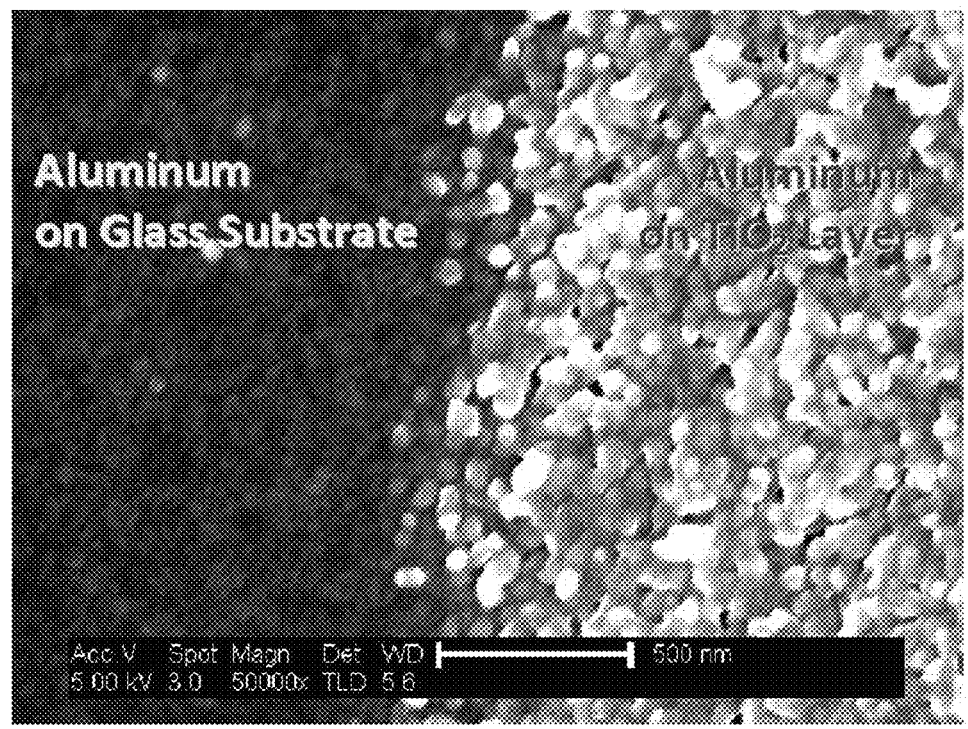
FIG. 4 is a view illustrating an SEM photograph of the upper portion of a current collecting electrode.
Figure 5:
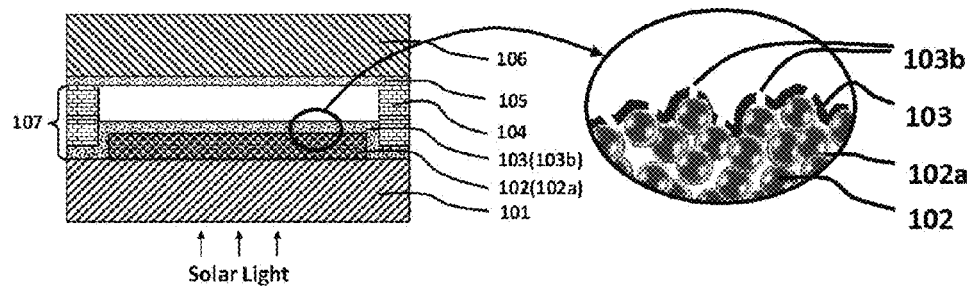

When a conductive material is deposited in order to form the current collecting electrode 103, a topographical form may depend on a surface topographical form of the porous semiconductor layer 102. For example, a rough surface having many through-holes may be formed on a rough surface such as the porous semiconductor layer 102. As illustrated in the following FIG. 4, when a conductive material such as aluminum is deposited on a porous semiconductor layer (TiO$_2$), the surface of the aluminum layer may be very rough substantially similar to the surface of the porous semiconductor layer, while having many through-holes. However, as illustrated in the following FIG. 4, when the aluminum layer is deposited on a glass substrate, the surface of the aluminum layer may be smooth and dense without having a through-hole. Here, when the current collecting electrode 103 is coated on the surface of the rough porous semiconductor layer 102, the surface of the current collecting electrode may also have a rough surface substantially similar to the topographical form of the surface of the porous semiconductor layer 102, as illustrated in the following FIG. 5. Therefore, the contact area between the current collecting electrode and the porous semiconductor layer may be maximized, and the power conversion efficiency of the solar cell may be increased. Furthermore, by forming the surface of the current collecting electrode to be substantially the same as the topographical form of the surface of the porous semiconductor layer, the current collecting electrode may comprise at least one through-hole without a separately additional treatment such as patterning or a pore forming auxiliary agent.

In order to obtain the current collecting electrode 103 having substantially the same topographical form as that of the surface of the porous semiconductor layer 102, it is preferred that the thickness of the current collecting electrode is controlled to a range from 5 nm to 1,000 nm using the above-described fabrication method.

According to the present invention, in order to form the current collecting electrode 103 having at least one through-hole, physical vapor deposition of a metal or a conductive oxide is preferably applied. For the deposition of the metal, aluminum, titanium, nickel, platinum and/or tungsten are preferably applied. For the deposition of the conductive oxide, fluorine-doped tin oxide (FTO) and tin-doped indium oxide (ITO) are preferably applied.

In the case of physical vapor deposition of a metal or a conductive oxide, the number of through-holes of the current collecting electrode 103 may be controlled by changing a deposition rate, and the deposition rate may be controlled to 0.01 nm/sec to 50 nm/sec. The deposition rate of the current collecting electrode 103 is preferably 0.05 nm/sec to 25 nm/sec. When the deposition rate of the current collecting electrode 103 is 0.01 nm/sec to 50 nm/sec, it is possible to fabricate the current collecting electrode 103 having at least one through-hole.

In the case of physical vapor deposition of a metal or a conductive oxide, the number of through-holes of the current collecting electrode 103 is not particularly limited as long as the number of through-holes allows a photosensitizing dye solution and an electrolyte material to be permeated. The number of through-holes of the current collecting electrode 103 may be 0.01 hole/mm$^2$ to $10^9$ hole/mm$^2$, preferably 0.1 hole/mm$^2$ to $10^8$ hole/mm$^2$, and more preferably 1 hole/mm$^2$ to $10^7$ hole/mm$^2$.

In the case of physical vapor deposition of a metal or a conductive oxide, the diameter of through-holes in the current collecting electrode 103 is not particularly limited. The diameter of through-holes in the current collecting electrode 103 may be 1 nm to $10^5$ nm, preferably 3 nm to $10^4$ nm, and more preferably 5 nm to $10^3$ nm.

In the case of physical vapor deposition of a metal or a conductive oxide, the thickness of the current collecting electrode 103 is an important element. A thick film does not form a through-hole and a thin film does not have sufficient conductivity for collecting electrons from the porous semiconductor layer 102. The film thickness of the current collecting electrode 103 may be 5 nm to 1,000 nm, preferably 8 nm to 500 nm, and more preferably 12 nm to 300 nm. When the film thickness of the current collecting electrode 103 is less than 5 nm, conductivity of the current collecting electrode may be too low to be used as a current collecting electrode. On the contrary, when the film thickness of the current collecting electrode 103 exceeds 1,000 nm, there may occur a problem in that through-holes are too small for a dye solution and an electrolyte solution to be permeated via the through-holes.

The current collecting electrode may or may not be transparent. When an additional porous semiconductor layer 202 or 302 is provided on the current collecting electrode, it is preferred that the current collecting electrode 103 or 203 is transparent such that irradiated light reaches the additional porous semiconductor layer through the transparent current collecting electrode (FIGS. 6 to 9). When the current collecting electrode is transparent, the current collecting electrode 103 may be formed in the form of a thin film made of a metal, a conductive oxide, or a carbon material.

Figure 6:
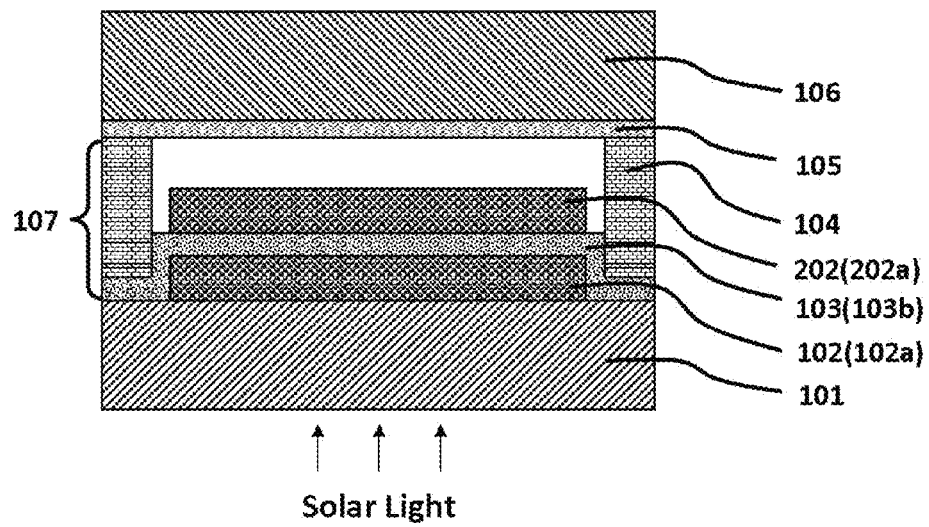
FIG. 6 is a view schematically illustrating a dye-sensitized solar cell according to a second exemplary embodiment of the present invention.
Figure 7:
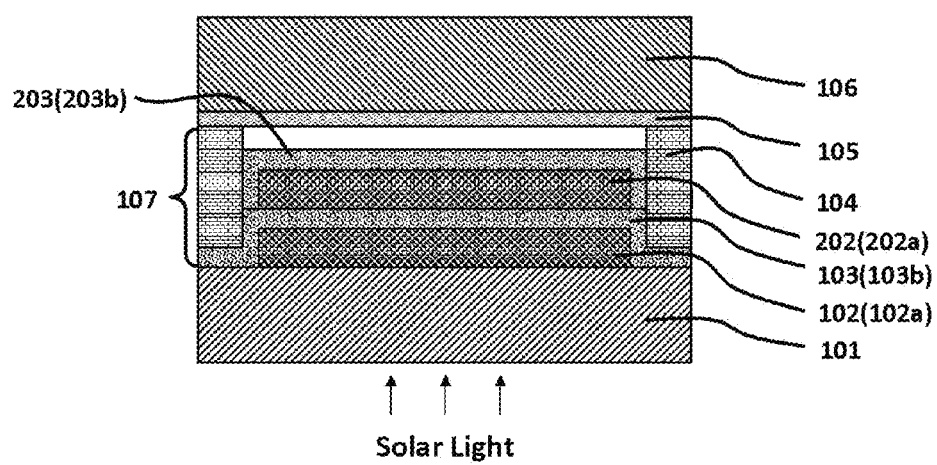
FIG. 7 is a view schematically illustrating a dye-sensitized solar cell according to a third exemplary embodiment of the present invention.
Figure 8:
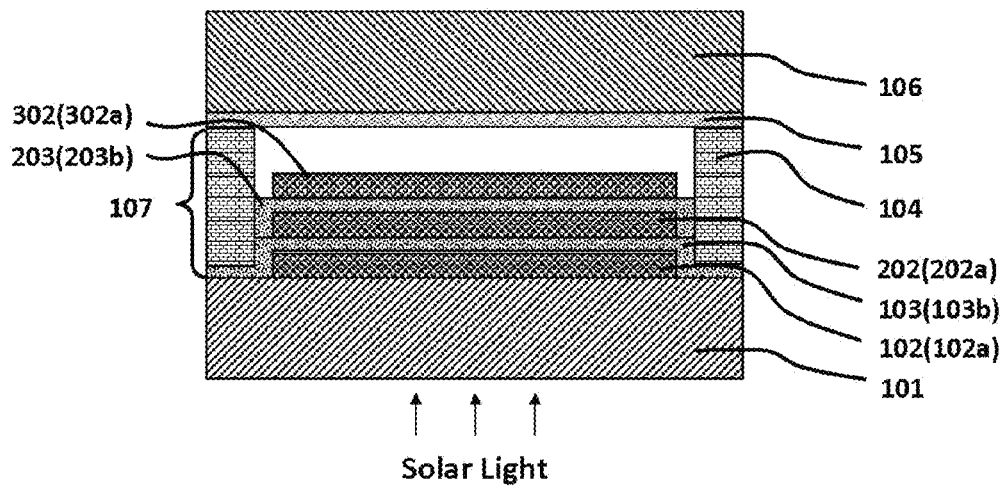
FIG. 8 is a view schematically illustrating a dye-sensitized solar cell according to a fourth exemplary embodiment of the present invention.
Figure 9:
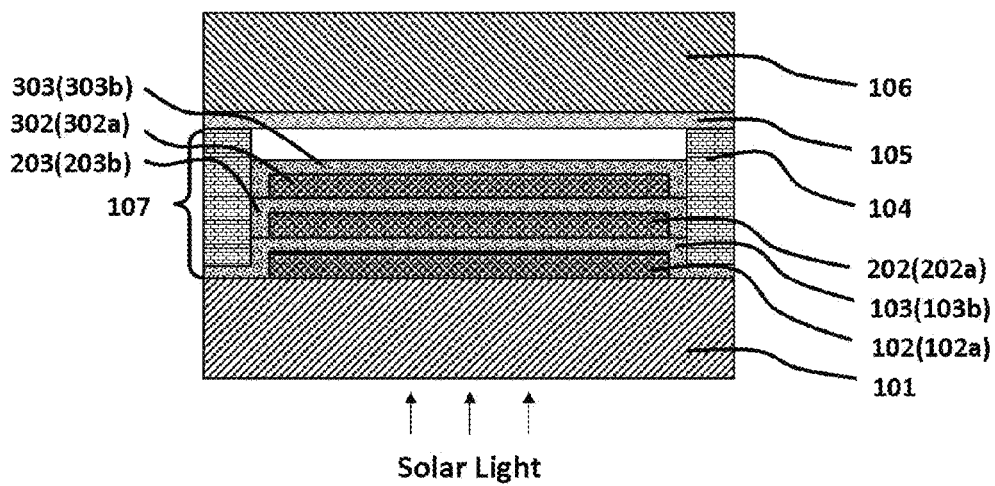
FIG. 9 is a view schematically illustrating a dye-sensitized solar cell according to a fifth exemplary embodiment of the present invention.

When the current collecting electrode 103 is transparent, the second porous semiconductor layer 202 may be formed on the current collecting electrode 103, as illustrated in the following FIG. 6. In the structure, more electrons may be collected from the two porous semiconductor layers 102 and 202 caused by an increased contact area between the current collecting electrode 103 and the two porous semiconductor layers 102 and 202, thereby obtaining high power conversion efficiency. At this time, the second porous semiconductor layer 202 may physically separate the current collecting electrode 103 from the catalyst electrode 105, thereby making it unnecessary to have a spacer between the current collecting electrode 103 and the catalyst electrode 105.

In order to utilize different wavelength ranges from irradiated light, it is possible to use different dye sensitizers 102a and 202a on the porous semiconductor layers 102 and 202, respectively. As illustrated in the following FIG. 7, in order to additionally increase the contact area between the current collecting electrode and the porous semiconductor layer, the second current collecting electrode 203 may be formed on the second porous semiconductor layer 202. The second current collecting electrode 203 may be generally transparent, but may not be transparent. Likewise, in order to increase the power conversion efficiency, as illustrated in the following FIG. 8, the third porous semiconductor layer 302 may be formed on the second current collecting electrode 203, and as illustrated in the following FIG. 9, a third current collecting electrode 303 may be formed on the third porous semiconductor layer 302. In the structures of the following FIGS. 8 and 9, in order to utilize different wavelength ranges from irradiated light, it is possible to use different dye sensitizers 102a, 202a, and 302a on the porous semiconductor layers 102, 202, and 302, respectively.

After the conductive material is deposited, a heat treatment may be performed. As described above, the current collecting electrodes 103, 203, and 303 having at least one through-hole 103b, 203b, or 303b may be formed on the porous semiconductor layers 102, 202, and 302 by simple physical vapor deposition or chemical deposition of a conductive material, and after the deposition, no mask or photolithography process may be used.

The dye sensitizers 102a, 202a, and 302a may be dye sensitizers having an absorbance in a wide range of a visible light region and/or an IR region, and may be, for example, organic dyes, metal complex dyes, and the like. Examples of the organic dyes comprise azo type dyes, quinone type dyes, quinone-imine type dyes, quinacridone type dyes, squarylium type dyes, cyanine type dyes, merocyanine type dyes, triphenylmethane type dyes, xanthene type dyes, porphyrin type dyes, perylene type dyes, indigo type dyes, and naphthalocyanine type dyes. Examples of the metal complex dyes comprise phthalocyanine type dyes and ruthenium type dyes, comprising, as a dominant metal, a metal such as Cu, Ni, Fe, Co, V, Sn, Si, Ti, Ge, Cr, Zn, Ru, Mg, Al, Pb, Mn, In, Mo, Y, Zr, Nb, Sb, La, W, Pt, Ta, Ir, Pd, Os, Ga, Tb, Eu, Rb, Bi, Se, As, Sc, Ag, Cd, Hf, Re, Au, Ac, Tc, Te, and Rh.

Further, it is preferred that the dye sensitizers 102a, 202a, and 302a comprise a functional group for bonding to the porous semiconductor layers 102, 202, and 302. Examples of the functional group comprise a carboxyl group, an alkoxy group, a hydroxyl group, a sulfonic acid group, an ester group, a mercapto group, or a phosphonyl group. Among them, ruthenium complex dyes are more preferred. In the dye-sensitized solar cell, the dye sensitizers 102a, 202a, and 302a may be the same as or different from each other. In order to extend a photoelectric conversion wavelength range of the dye sensitizer and thereby improving photoelectric conversion efficiency, two or more kinds of sensitizing dye compounds having different photoelectric conversion wavelength ranges may be used in combination. In this case, it is possible to select and apply the types and quantity ratio of the dye sensitizer compounds according to the wavelength range and intensity distribution of irradiated light.

Before the dye sensitizer 102a is adsorbed in the porous semiconductor layer 102, for activation of the surface of the porous semiconductor layer and/or an increase in the surface area thereof, it is possible to perform a post-treatment such as a semiconductor material post-treatment using a semiconductor material precursor solution, a heat treatment, a plasma treatment, an ozone treatment, and a chemical treatment. Examples of the semiconductor material for the post-treatment comprise titanium oxide, zinc oxide, tin oxide, niobium oxide, zirconium oxide, cerium oxide, tungsten oxide, silicon oxide, aluminum oxide, nickel oxide, tantalum oxide, barium titanate, strontium titanate, calcium titanate, zinc sulfide, lead sulfide, bismuth sulfide, cadmium sulfide, $CuAlO_2$, $SrCu_2O_2$, and the like. As a result of the semiconductor material post-treatment, a post-treatment layer (semiconductor thin film) is formed on the porous semiconductor layer 102. For example, it is preferred that the thickness of the post-treatment layer is 0.1 nm to 50 nm, particularly 0.2 nm to 25 nm.

The dye sensitizer 102a may be adsorbed in the porous semiconductor layer 102 by immersing the porous semiconductor layer 102 coated with the current collecting electrode 103 in a solution comprising the dye sensitizer. The solution comprising the dye sensitizer may be permeated into the porous semiconductor layer 102 via the through-hole 103b of the current collecting electrode 103. The solution is not particularly limited as long as the dye sensitizer may be dissolved therein. Examples of the solution comprise organic solvents such as alcohol, toluene, acetonitrile, chloroform, and dimethylformamide. In general, these solvents are preferably purified ones. The concentration of the dye sensitizer in the solvent may be controlled depending on the types of dye and solvent used and the conditions of the step of adsorbing the dye sensitizer, and is preferably $1 \times 10^{-5}$ mol/l or more.

In the immersion process of the porous semiconductor layer 102 in the solution comprising the dye sensitizer, the temperature, pressure, and time may be varied, if necessary. The immersion process may be performed once or a plurality of times, and after the immersion process, a drying process may be properly performed.

In the dye-sensitized solar cell according to the present invention, in order to prevent the loss of the electrolyte material 107 and maintain a proper space between the current collecting electrode 103 and the catalyst electrode 105, the sealing spacer 104 may be used between the transparent substrate 101 or the current collecting electrode 103 and the second substrate 106 or the catalyst electrode 105. The sealing spacer 104 may be formed of a thermoplastic film, a resin, glass, or the like. Examples of the thermoplastic film comprise commercially available Surlyn® resins, Bynel® resins, and the like. Examples of the resin comprise photocurable resins such as thermosetting resins, epoxy resins, urethane resins, and polyester resins. In particular, hot-melt Surlyn® resin which may be easily controlled is preferred. When the solar cell requires long-term durability, it is preferred that the sealing spacer 104 is formed of glass. Of course, when the porous semiconductor layers 202 and 302 are provided between the current collecting electrodes 103 and 203 and the catalyst electrode 105, electrical contact may be avoided even when there is no spacer.

As long as the electrical contact may be prevented between the current collecting electrode 103 and the catalyst electrode 105, the thickness of the sealing spacer 104 is not particularly limited. After the sealing spacer 104 is applied, the thickness of gap between the current collecting electrode 103 and the catalyst electrode 105 may be 0.1 mm to 1,000 mm, preferably 1 mm to 500 mm, and more preferably 5 mm to 100 mm.

Figure 10:
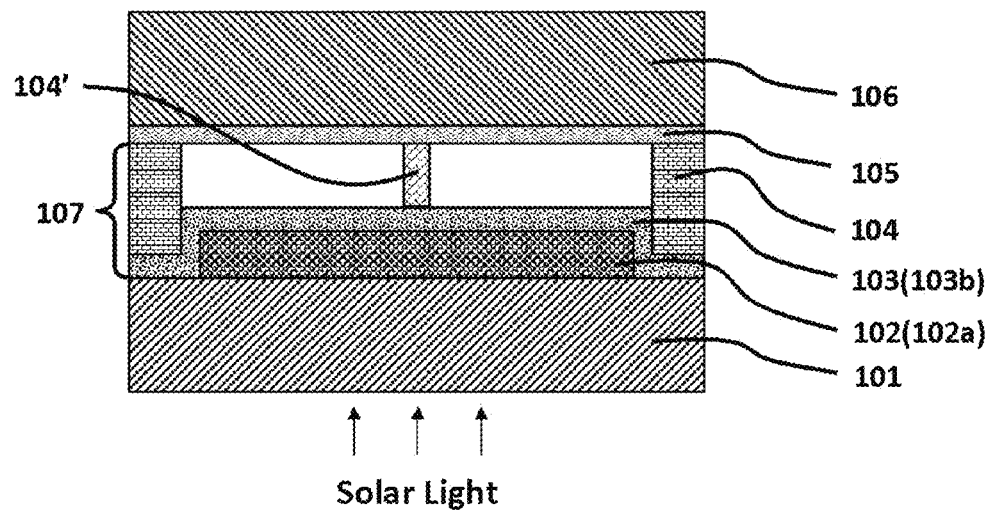
FIG. 10 is a view schematically illustrating a dye-sensitized solar cell according to a sixth exemplary embodiment of the present invention.
Figure 11:
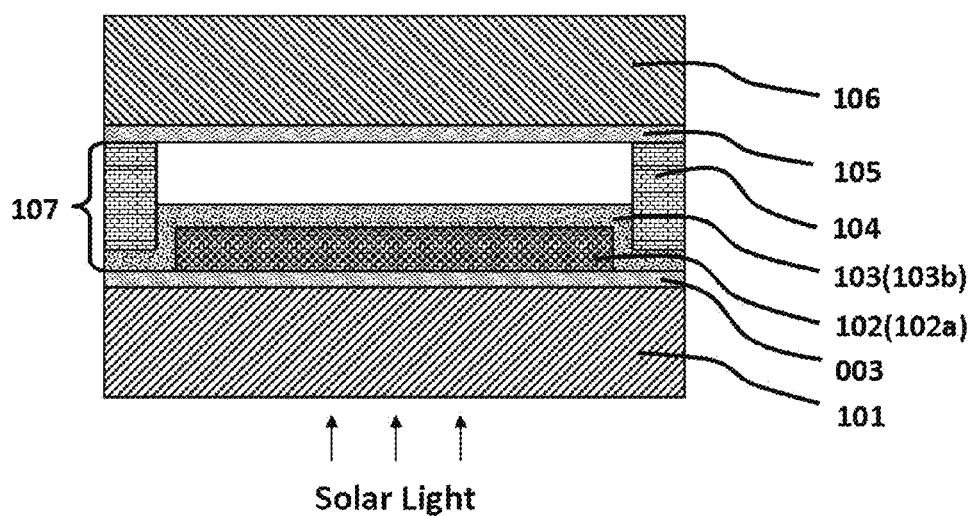
FIG. 11 is a view schematically illustrating a dye-sensitized solar cell according to a seventh exemplary embodiment of the present invention.
Figure 12:
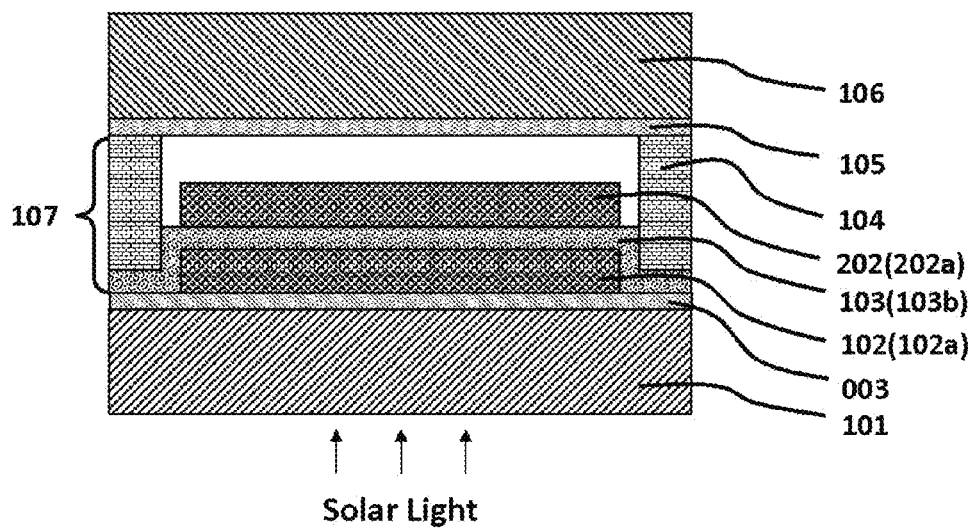
FIG. 12 is a view schematically illustrating a dye-sensitized solar cell according to an eighth exemplary embodiment of the present invention.
Figure 13:
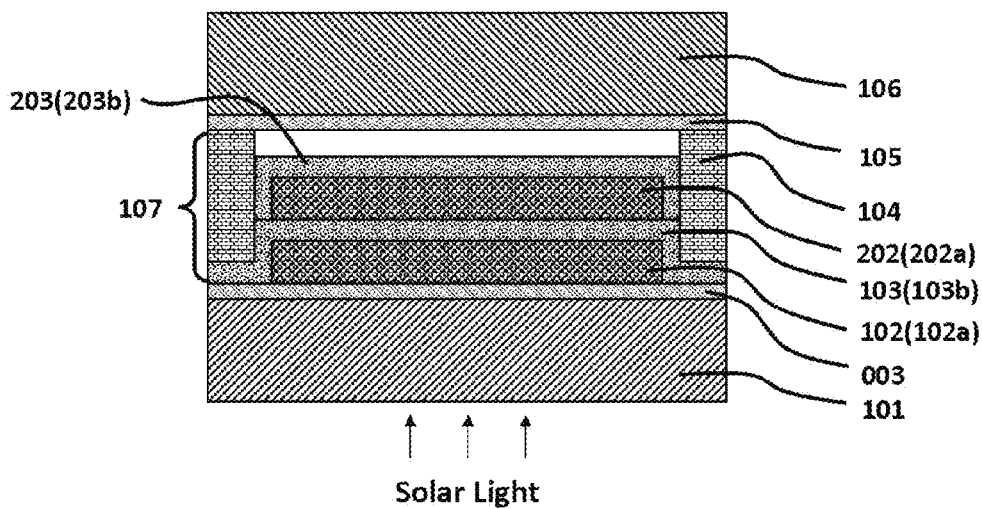
FIG. 13 is a view schematically illustrating a dye-sensitized solar cell according to a ninth exemplary embodiment of the present invention.
Figure 14:
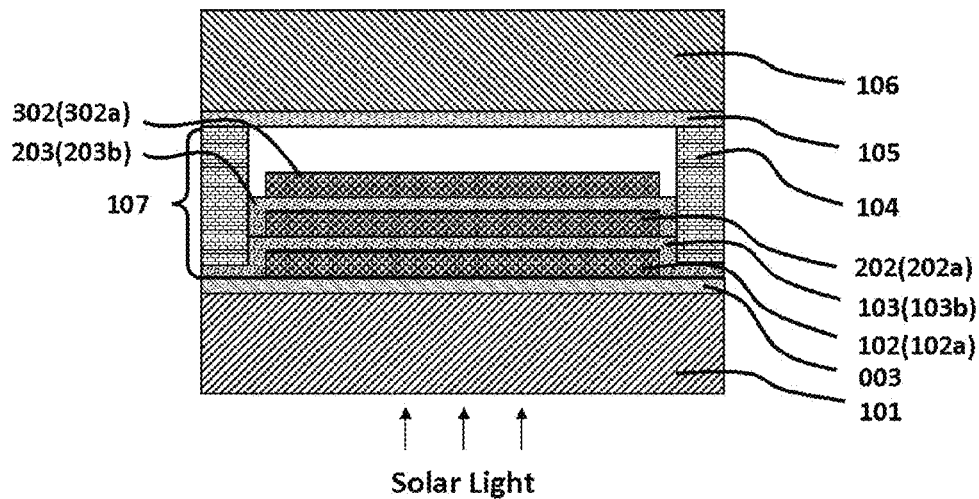
FIG. 14 is a view schematically illustrating a dye-sensitized solar cell according to a tenth exemplary embodiment of the present invention.
Figure 15:
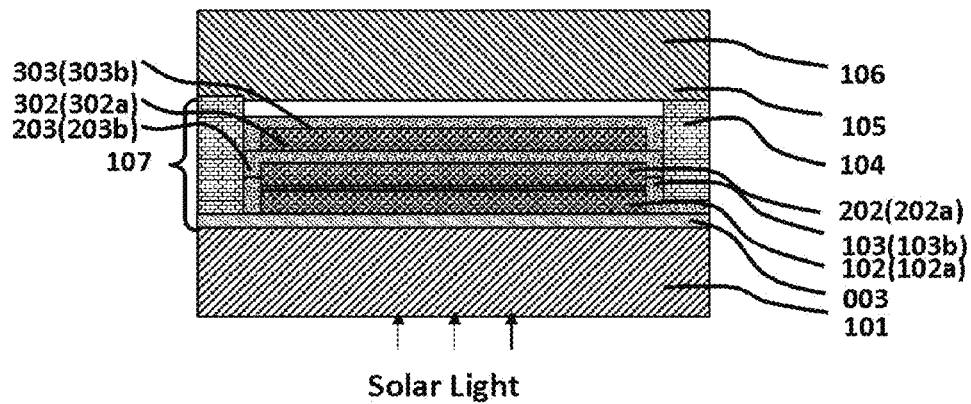
FIG. 15 is a view schematically illustrating a dye-sensitized solar cell according to an eleventh exemplary embodiment of the present invention.

As illustrated in the following FIG. 10, one or more internal spacer 104' may be used between the current collecting electrode 103 and the catalyst electrode 105, if necessary. The number and form of the internal spacers 104' is not particularly limited. The larger the area of the porous semiconductor layer 102 is, the more the internal spacers 104' may be required. The internal spacer 104' may be provided in the shape of a sphere, a cylinder, a prism, a line (for example, strip type or bar type), and the like. The sealing spacer 104 may be made of a thermoplastic film, a resin, glass, or the like.

The catalyst electrode 105 may be made of a catalytically active material, or at least one of a metal, a conductive oxide, and a resin, which comprise a catalytically active material therein. Examples of the catalytically active material comprise noble metals such as platinum and rhodium, and carbon black. These materials may also have conductivity. It is preferred that the catalyst electrode 105 is formed of a noble metal having catalytic activity and electrochemical stability. In particular, it is possible to preferably apply platinum which has high catalytic activity and is less likely to be dissolved in an electrolyte solution.

When a metal, a conductive oxide, or a conductive resin exhibiting no catalytic activity is used, it is preferred that a catalytically active material is comprised in the materials. Examples of the metal comprise aluminum, copper, chromium, nickel, tungsten, and the like, and examples of the conductive resin comprise polyaniline, polypyrrole, polyacetylene, PEDOT-PSS, poly-EDT, and the like. These conductive materials may be used either alone or in combination thereof.

The catalyst electrode 105 may be formed by depositing a material having catalytic activity and electrical conductivity on the second substrate 106. Otherwise, a metal layer, a conductive oxide layer or a conductive resin layer exhibiting no catalytic activity may be formed on the second substrate 106, and then a catalytically active material may be successively deposited thereon.

The second substrate 106 may or may not be transparent. As long as the second substrate 106 is tough enough to provide a dye-sensitized solar cell which supports a substrate and has high durability, the second substrate 106 is not particularly limited. The second substrate 106 may be glass, plastic, metal, ceramic, or the like. Examples of the plastic substrate comprise polyester, polyphenylene sulfide, polycarbonate, polysulfone, polyethylidene norbornene, and the like. Examples of the metal substrate comprise tungsten, titanium, nickel, platinum, gold, copper, and the like. Examples of the ceramic substrate comprise alumina, mullite, zirconia, silicon nitride, sialon, titanium nitride, aluminum nitride, silicon carbide, titanium carbide, aluminum carbide, and the like.

The electrolyte material 107 may be provided between the porous semiconductor layer 102 and the catalyst electrode 105 such that ionic conduction may be carried out between the porous semiconductor layer 102 and the catalyst electrode 105. The electrolyte material 107 may be prepared from an electrolyte solution. In general, the electrolyte solution comprises a solvent and various additives in addition to the electrolyte material 107. Examples of the electrolyte material 107 comprise: (1) $I_2$ and an iodide; (2) $Br_2$ and a bromide; (3) a metal complex such as a ferrocyanide-ferricyanide complex, a ferrocene-ferrocinium ion complex, or a cobalt redox complex; (4) a sulfur compound such as sodium polysulfide or alkylthiol-alkyldisulfide; (5) a viologen dye; and (6) hydroquinone-quinone. In relation to the iodide of the electrolyte (1), there may be used metal iodides such as LiI, NaI, KI, CsI and $CaI_2$, quaternary ammonium iodides such as tetralkylammonium iodide, pyridinium iodide and imidazolium iodide, and the like. In relation to the bromide of the electrolyte (2), there may be used metal bromides such as LiBr, NaBr, KBr, CsBr, and $CaBr_2$, quaternary ammonium bromides such as tetralkylammonium bromide and pyridinium bromide, and the like. Among these electrolyte materials, a combination of $I_2$ and LiI or the quaternary ammonium iodide such as pyridinium iodide or imidazolium iodide is more preferred. These electrolyte materials may be used either alone or in combination thereof.

It is preferred that the solvent of the electrolyte solution is a solvent having low viscosity, high ionic mobility, and sufficient ionic conductivity. Examples of the solvent comprise: (1) carbonates such as ethylene carbonate and propylene carbonate; (2) heterocyclic compounds such as 3-methyl-2-oxazolidinone; (3) ethers such as dioxane and diethyl ether; (4) chain ethers such as ethylene glycol dialkylether, propylene glycol dialkylether, polyethylene glycol dialkylether, and polypropylene glycol dialkylether; (5) monoalcohols such as methanol, ethanol, ethylene glycol monoalkylether, and propylene glycol monoalkylether; (6) polyalcohols such as ethylene glycol, propylene glycol, polyethylene glycol, polypropylene glycol, and glycerin; (7) nitriles such as acetonitrile, glutarodinitrile, methoxyacetonitrile, propionitrile, and benzonitrile; and (8) aprotic polar solvents such as dimethylsulfoxide and sulfolane.

In the dye-sensitized solar cell in the related art as illustrated in the following FIG. 16, it is known that the optimized thickness of the porous semiconductor layer is 12 μm to 15 μm. When the thickness of the porous semiconductor layer is less than 12 μm, the amount of the dye sensitizer adsorbed to the porous semiconductor layer is decreased and the dye sensitizer absorbs lesser incident light, thereby decreasing the overall efficiency. On the contrary, when the thickness of the porous semiconductor layer exceeds 15 μm, the amount of the dye sensitizer adsorbed to the porous semiconductor layer is enough to absorb most of the incident light. However, most of the electrons injected into a conduction band of a semiconductor part disposed at an upper surface spaced from the first current collecting electrode 503 may be lost by recombination thereof before being collected into the first current collecting electrode 503. Accordingly, when the thickness exceeds 15 μm, the overall efficiency is not improved as the thickness of the semiconductor layer is increased.

In order to overcome the thickness limitation of the porous semiconductor layer, an additional transparent current collecting electrode 003 may be comprised between the transparent substrate 101 and the porous semiconductor layer 102 (FIGS. 11 to 15). The additional transparent current collecting electrode 003 increases an electrical contact area between the semiconductor layer and the current collecting electrode. Based on the structure, the overall efficiency may be further improved even when the thickness of the porous semiconductor layer exceeds 15 μm. Accordingly, the maximum efficiency of the dye-sensitized solar cell structure may be more enhanced than the structure in the related art as illustrated in the following FIG. 16.

Hereinafter, the present invention will be described in more detail through the Examples, but the scope of the present invention is not limited by the following Examples.

EXAMPLES

Example 1

A dye-sensitized solar cell was fabricated by the following method.

(1) Fabrication of Transparent Substrate 101

As a transparent substrate for the dye-sensitized solar cell according to a first exemplary embodiment of the present invention as illustrated in the following FIG. 1, a microscope slide glass (Ted Pella, Inc., USA) having a size of 0.5 inch×1 inch was used. First, the microscope slide glass was washed with a washing solution using an ultrasonic bath for 10 minutes, and then washed with water and isopropanol. In order to remove residual organic contaminant materials, the microscope slide glass was heat-treated at 400° C. in air for 15 minutes.

(2) Fabrication of Porous Semiconductor Layer 102

A paste comprising nano particles (Ti-Nanoxide T20, Solaronix, Switzerland) having a diameter of 20 nm was doctor-bladed on the microscope slide glass to form a porous $TiO_2$ semiconductor layer 102. A uniform film having a thickness of 9.3+/−0.2 μm was formed by the one-time doctor-blading of the paste which had been sintered at 500° C. for 30 minutes. The film thickness was measured using a KLA Tencor P-10 profiler.

(3) Fabrication of Current Collecting Electrode 103

An aluminum film as the current collecting electrode 103 was deposited on the porous $TiO_2$ semiconductor layer 102 by performing thermal deposition (The BOC Edwards Auto 500 resistance evaporation system) at a deposition rate of 1.7 nm/sec under $2\times10^{-6}$ mbar. The thickness of the film measured with an SEM was 5 nm.

(4) Adsorption of Dye Sensitizer 102a in Porous Semiconductor Layer 102

The porous $TiO_2$ semiconductor layer 102 comprising the current collecting electrode 103 was immersed in a cis-di(thiocyanato)-N,N'-bis(2,2-bipyridyl-4-carboxylic acid-4-tetrabutylammonium carboxylate)ruthenium (II) (N-719 dye) solution in a 0.3 mM mixture of acetonitrile and tertbutyl alcohol (volume ratio, 1:1), and maintained at normal temperature for 20 hours to 24 hours for complete adsorption of the sensitizer.

(5) Second Substrate 106

A microscope slide glass having a thickness of 1 mm and a size of 0.5 inch×1 inch was used as a second substrate 106. A hole (diameter from 0.1 mm to 1 mm) was perforated on the second substrate 106 using an injector.

(6) Fabrication of Catalyst Electrode 105 on Second Substrate 106

A platinum film (thickness of 100 nm) was deposited on the microscope slide glass 106 having a size of 0.5 inch×1 inch using DC magnetron sputtering (Denton DV 502A) at normal temperature.

(7) Fabrication of Electrolyte Material 107

An electrolyte material 107 was prepared with a solution of 0.6 M BMII, 0.03 M $I_2$, 0.10 M guanidinium thiocyanate, and 0.5 M 4-tert-butylpyridine in a mixture of acetonitrile and valeronitrile (volume ratio, 85:15).

(8) Dye-Sensitized Solar Cell Assembly

A transparent substrate comprising a porous $TiO_2$ semiconductor layer and a catalyst electrode was assembled as a sandwich type cell and sealed with hot-melt Surlyn® spacer (SX1170-60, Solaronix, Switzerland) having a thickness of 60 μm. Thereafter, the electrolyte material was introduced through the hole on the second substrate 106 under vacuum. Finally, the hole was sealed with a 60 μm hot-melt Bynel® (SX1162-60, Solaronix, Switzerland) and a cover glass (thickness of 0.1 mm).

(9) Evaluation of Characteristics of Dye-Sensitized Solar Cell

The device was evaluated using a class-A 450W Oriel® Solar Simulator (Model 91195-A) equipped with an AM 1.5 global filter. The electric power was controlled so as to obtain an intensity of 100 mW/cm² using a Newport radiometer.

Examples 2 to 5

In Examples 2 to 5, dye-sensitized solar cells having current collecting electrodes with different thicknesses were fabricated in the same manner as in Example 1. As in Example 1, a porous TiO2 semiconductor layer having a thickness of 9.3 μm+/−0.2 μm was used as the porous semiconductor layer 102 as in Example 1. The power conversion efficiency is shown in the following Table 1.

Comparative Examples 1 and 2

Dye-sensitized solar cells were fabricated in the same manner as in Example 1, except that the current collecting electrodes were fabricated on the TiO$_2$ layer to have a thickness of 2 nm and 2,000 nm, respectively. The power conversion efficiency is shown in the following Table 1.

TABLE 1

| | First current collecting electrode | Form of first current collecting electrode | Topographical morphology of first current collecting electrode | Power conversion efficiency |
|---|---|---|---|---|
| Example 1 | Aluminum film having a thickness of 5 nm | Porous | Substantially the same as semiconductor layer | 3.7% |
| Example 2 | Aluminum film having a thickness of 20 nm | Porous | Substantially the same as semiconductor layer | 6.6% |
| Example 3 | Aluminum film having a thickness of 50 nm | Porous | Substantially the same as semiconductor layer | 7.2% |
| Example 4 | Aluminum film having a thickness of 500 nm | Porous | Substantially the same as semiconductor layer | 3.6% |
| Example 5 | Aluminum film having a thickness of 1,000 nm | Porous | Substantially the same as semiconductor layer | 2.1% |
| Comparative Example 1 | Aluminum film having a thickness of 2 nm | Porous | Substantially the same as semiconductor layer | 0.05% |
| Comparative Example 2 | Aluminum film having a thickness of 2,000 nm | No through-hole | Flat surface | 0.04% |

As can bee seen in the result of Table 1, the dye-sensitized solar cells (Examples 1 to 5) comprising the current collecting electrode having a thickness from 5 nm to 1,000 nm exhibit higher power conversion efficiencies than those of Comparative Examples 1 and 2. In addition, according to the SEM photographs illustrated in the following FIGS. 3 and 4, it can be seen that the current collecting electrodes of the dye-sensitized solar cells according to Examples 1 to 5 have through-holes and substantially the same topographical morphology as that of the surface of the porous semiconductor layer.

Example 6

A dye-sensitized solar cell was fabricated in the same manner as Example 1, except that a microscope slide glass was pre-treated with TiCl$_4$ in order to improve adhesion force. At this time, the pre-treatment was performed using a pre-treatment method of a semiconductor material using a semiconductor material precursor solution between the transparent substrate 101 and the porous semiconductor layer 102, and a 50 nm aluminum film was used as the current collecting electrode 103. The pre-treatment using the TiCl$_4$ precursor solution was performed as follows. The microscope slide glass plate was immersed in a 40 mM TiCl$_4$ aqueous solution at 70° C. for 30 minutes, washed with water and ethanol, and dried with N$_2$ gas at high pressure. The power conversion efficiency of the solar cell according to Example 6 was 7.3% similar to Example 3. However, when compared to Example 3, the porous semiconductor layer 102 on the transparent substrate 101 was very stable without any peeling off.

Example 7

A dye-sensitized solar cell was fabricated in the same manner as in Example 1, except that a 50 nm-nickel film was used as the current collecting electrode 103. Nickel was deposited on a TiO$_2$ semiconductor layer having a thickness of 9.3 μm+/−0.2 μm using magnetron sputtering at normal temperature instead of using aluminum. The power conversion efficiency is shown in the following Table 2.

Example 8

A dye-sensitized solar cell was fabricated in the same manner as in Example 1, except that a 50 nm-titanium film was used as the current collecting electrode 103. Titanium was deposited on a TiO$_2$ semiconductor layer having a thickness of 9.3 μm+/−0.2 μm using magnetron sputtering at normal temperature instead of using aluminum. The power conversion efficiency is shown in the following Table 2.

Example 9

A dye-sensitized solar cell was fabricated in the same manner as in Example 9, except that a 7 nm-titanium film was used as a first current collecting electrode 103, an additional second porous TiO$_2$ semiconductor layer (thickness of 7 μm) was formed on the first current collecting electrode, and an additional second current collecting electrode 203 was formed on the second porous TiO$_2$ semiconductor layer. Here, the material and fabrication method of the second porous TiO2 semiconductor layer are the same as the material and fabrication method of the porous semiconductor layer as described in Example 1. The power conversion efficiency is shown in the following Table 2.

TABLE 2

| | First semiconductor layer | First current collecting electrode | Second semiconductor layer | Power conversion efficiency |
|---|---|---|---|---|
| Example 7 | 9.3 +/− 0.2 μm TiO$_2$ | Nickel film having a thickness of 50 nm | — | 6.3% |
| Example 8 | 9.3 +/− 0.2 μm TiO$_2$ | Titanium film having a thickness of 50 nm | — | 6.7% |
| Example 9 | 9.3 +/− 0.2 μm TiO$_2$ | Titanium film having a thickness of 7 nm | TiO$_2$ having a thickness of 7 μm | 8.2% |

Example 10

A dye-sensitized solar cell was fabricated in the same manner as in Example 8, except that after the current collecting electrode 103 as a 50 nm-titanium film was deposited, the porous semiconductor layer 102 was subjected to post-treatment with TiCl$_4$ by a pre-treatment method of a semiconductor material using a semiconductor material precursor solution in order to improve adsorption of a dye and increase the surface area of the porous semiconductor layer 102. The post-treatment using the TiCl$_4$ precursor solution was performed as follows. A microscope slide glass plate comprising the porous semiconductor layer 102 on which a 50 nm-titanium film had been deposited was immersed in a 40 mM TiCl$_4$ aqueous solution at 70° C. for 30 minutes, washed with water and ethanol, and dried with N$_2$ gas at high pressure. After the post-treatment, the surface of the porous semiconductor layer 102 was covered with nanometer-sized TiO$_2$ particles and exhibited a wider surface area. The power conversion efficiency of the solar cell according to Example 10 was 7.2%, which is considerably improved when compared to Example 8.

Comparative Example 3

Figure 16:
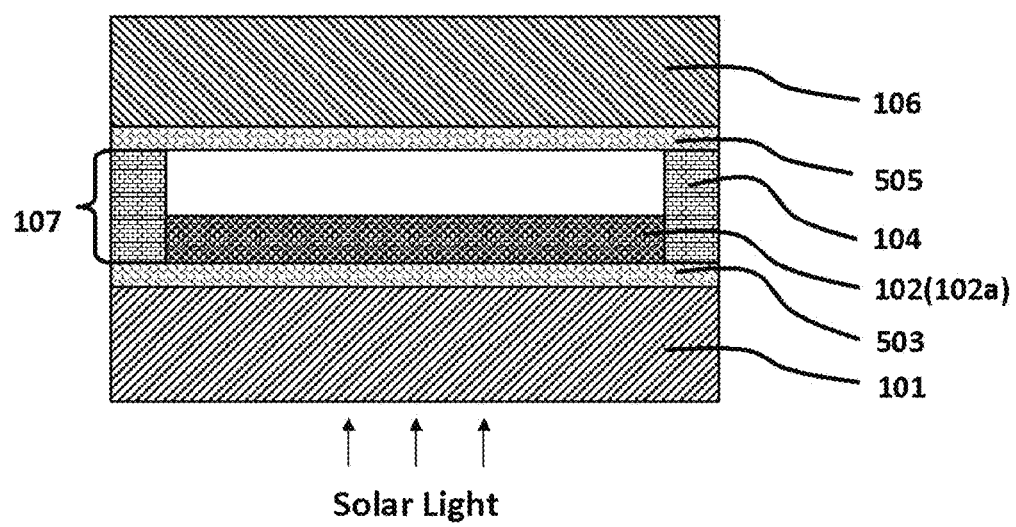
FIG. 16 is a view schematically illustrating a dye-sensitized solar cell in the related art.

A dye-sensitized solar cell as illustrated in FIG. 16 was fabricated in the same manner as in Example 3, except that an FTO glass was provided between the transparent substrate 101 and the porous TiO$_2$ semiconductor layer 102 while using a transparent conductive electrode 503 instead of the first current collecting electrode 103. The power conversion efficiency compared to that of Example 3 is shown in the following Table 3. Comparative Example 3 exhibited a 5.1% efficiency.

TABLE 3

|  | First transparent substrate | First current collecting electrode | Power conversion efficiency |
|---|---|---|---|
| Example 3 | Slide glass | Aluminum film having a thickness of 50 nm deposited on first semiconductor layer | 7.2% |
| Comparative Example 3 | Slide glass | FTO deposited on glass substrate | 5.1% |

As can be seen in the result of Table 3, the dye-sensitized solar cell comprising the current collecting electrode deposited on the porous semiconductor layer as in Example 3 exhibited much better efficiency than that of the dye-sensitized solar cell comprising the current collecting electrode between the transparent substrate and the porous semiconductor layer as in Comparative Example 3.

In the present invention, the most practical and preferred exemplary embodiments have been described, but the present invention should not be interpreted as being restricted to the Examples and the drawings. In the present invention, various modifications may be made within the spirit and scope described in the claims.

The invention claimed is:
1. A dye-sensitized solar cell comprising:
a transparent substrate;
a porous semiconductor layer provided directly on the transparent substrate and comprising a dye sensitizer;
a current collecting electrode provided directly on the porous semiconductor layer and having a structure including at least one through-hole;
a catalyst electrode;
an electrolyte material provided between the transparent substrate and the catalyst electrode; and
a pre-treatment layer formed directly on the transparent substrate and between the transparent substrate and the porous semiconductor layer or a post-treatment layer formed directly on a surface of the porous semiconductor layer,
wherein the pre-treatment layer or post-treatment layer comprise titanium oxide, zinc oxide, tin oxide, niobium oxide, zirconium oxide, cerium oxide, tungsten oxide, silicon oxide, aluminum oxide, nickel oxide, tantalum oxide, barium titanate, strontium titanate, calcium titan-ate, zinc sulfide, lead sulfide, bismuth sulfide, cadmium sulfide, CuAlO$_2$, SrCu$_2$O$_2$, or a combination thereof,
wherein the each thickness of the pre-treatment layer or the post-treatment layer is 0.2 nm to 25 nm.
2. The dye-sensitized solar cell of claim 1, wherein the current collecting electrode has a thickness from 5 nm to 1,000 nm, and a surface of the current collecting electrode has the same topographical morphology as that of a surface of the porous semiconductor layer.
3. The dye-sensitized solar cell of claim 1, further comprising:
a sealing spacer provided between the transparent substrate or the current collecting electrode and the catalyst electrode.
4. The dye-sensitized solar cell of claim 1, further comprising:
at least one internal spacer provided between the current collecting electrode and the catalyst electrode.
5. The dye-sensitized solar cell of claim 1, wherein the current collecting electrode comprises titanium, nickel, platinum, gold, silver, copper, aluminum, tungsten, rhodium, indium, tin oxide, fluorine-doped tin oxide (PTO), indium oxide, tin-doped indium oxide (ITO), zinc oxide, carbon nanotubes, graphene, carbon black, PEDOT-PSS, polypyrrole, polyaniline, poly-EDT, or a combination thereof.
6. The dye-sensitized solar cell of claim 1, wherein the porous semiconductor layer comprises titanium oxide, zinc oxide, tin oxide, niobium oxide, zirconium oxide, cerium oxide, tungsten oxide, silicon oxide, aluminum oxide, nickel oxide, tantalum oxide, barium titanate, strontium titanate, calcium titanate, zinc sulfide, lead sulfide, bismuth sulfide, cadmium sulfide, CuAlO$_2$, SrCu$_2$O$_2$, or a combination thereof.
7. The dye-sensitized solar cell of claim 1, wherein the porous semiconductor layer is formed of particles having an average diameter from 1 nm to 400 nm.
8. The dye-sensitized solar cell of claim 1, further comprising:
a transparent current collecting electrode provided between the transparent substrate and the porous semiconductor layer.
9. A dye-sensitized solar cell comprising:
a transparent substrate;
a first porous semiconductor layer provided directly on the transparent substrate and comprising a first dye sensitizer;
a current collecting electrode provided directly on the first porous semiconductor layer;
a second porous semiconductor layer provided on the current collecting electrode and comprising a second dye sensitizer;
a catalyst electrode;
an electrolyte material provided between the transparent substrate and the catalyst electrode; and
a pre-treatment layer formed directly on the transparent substrate and between the transparent substrate and the first porous semiconductor layer or a post-treatment layer formed directly on a surface of the first or second porous semiconductor layer,
wherein the each thickness of the pre-treatment layer or the post-treatment layer is 0.2 nm to 25 nm.
10. The dye-sensitized solar cell of claim 9, wherein the first dye sensitizer and the second dye sensitizer are the same dye sensitizer.
11. The dye-sensitized solar cell of claim 9, wherein the first dye sensitizer and the second dye sensitizer absorb a wavelength range different from each other.

12. The dye-sensitized solar cell of claim 9, further comprising:
a second current collecting electrode provided on the second porous semiconductor layer.

13. The dye-sensitized solar cell of claim 12, further comprising:
a third porous semiconductor layer provided on the second current collecting electrode and comprising a third dye sensitizer.

14. The dye-sensitized solar cell of claim 13, wherein the first dye sensitizer, the second dye sensitizer, and the third dye sensitizer are the same dye sensitizer.

15. The dye-sensitized solar cell of claim 13, wherein at least two dye sensitizers of the first dye sensitizer, the second dye sensitizer, and the third dye sensitizer absorb a wavelength range different from each other.

16. The dye-sensitized solar cell of claim 13, further comprising:
a third current collecting electrode provided on the third porous semiconductor layer.

17. The dye-sensitized solar cell of claim 9, further comprising:
a current collecting electrode provided between the transparent substrate and the first porous semiconductor layer.

18. A method for fabricating a dye-sensitized solar cell, the method comprising:
preparing a transparent substrate;
forming a porous semiconductor layer directly on the transparent substrate;
depositing a current collecting electrode directly on the porous semiconductor layer such that a structure having at least one through-hole on the porous semiconductor layer is formed;
introducing a dye sensitizer into the porous semiconductor layer;
forming a catalyst electrode;
introducing an electrolyte material between the transparent substrate and the catalyst electrode and
introducing a pre-treatment layer formed directly on the transparent substrate and between the transparent substrate and the porous semiconductor layer or introducing a post-treatment layer formed directly on a surface of the porous semiconductor layer,
wherein the each thickness of the pre-treatment layer or the post-treatment layer is 0.2 nm to 25 nm.

19. The method of claim 18, wherein the current collecting electrode has a thickness from 5 nm to 1,000 nm, and a surface of the current collecting electrode has the same topographical morphology as that of a surface of the porous semiconductor layer.

20. The method of claim 18, further comprising:
forming at least one internal spacer between the current collecting electrode and the catalyst electrode.

21. The method of claim 18, wherein the current collecting electrode comprises titanium, nickel, platinum, gold, silver, copper, aluminum, tungsten, rhodium, indium, tin oxide, fluorine-doped tin oxide (PTO), indium oxide, tin-doped indium oxide (ITO), zinc oxide, carbon nanotubes, graphene, carbon black, PEDOT-PSS, polypyrrole, polyaniline, poly-EDT, or a combination thereof.

22. The method of claim 18, wherein the porous semiconductor layer comprises titanium oxide, zinc oxide, tin oxide, niobium oxide, zirconium oxide, cerium oxide, tungsten oxide, silicon oxide, aluminum oxide, nickel oxide, tantalum oxide, barium titanate, strontium titanate, calcium titanate, zinc sulfide, lead sulfide, bismuth sulfide, cadmium sulfide, $CuAlO_2$, $SrCu_2O_2$, or a combination thereof.

23. The method of claim 18, wherein the porous semiconductor layer is formed of particles having an average diameter from 1 nm to 400 nm.

24. The method of claim 18, further comprising:
forming an additional current collecting electrode between the transparent substrate and the porous semiconductor layer.

25. The method of claim 18, further comprising:
pre-treating the transparent substrate by a method selected from the group consisting of a semiconductor layer material pre-treatment using a semiconductor material precursor solution, a plasma treatment, an ozone treatment, and a chemical treatment.

26. The method of claim 18, further comprising:
post-treating the transparent substrate by a method selected from the group consisting of a semiconductor layer material post-treatment using a semiconductor material precursor solution, a heat treatment, a plasma treatment, an ozone treatment, and a chemical treatment.

27. A method for fabricating a dye-sensitized solar cell, the method comprising:
preparing a transparent substrate;
forming a first porous semiconductor layer directly on the transparent substrate;
depositing a first current collecting electrode directly on the first porous semiconductor layer;
introducing a first dye sensitizer into the first porous semiconductor layer;
forming a second porous semiconductor layer on the first current collecting electrode;
introducing a second dye sensitizer into the second porous semiconductor layer;
forming a catalyst electrode;
introducing an electrolyte material between the transparent substrate and the catalyst electrode; and
introducing a pre-treatment layer formed directly on the transparent substrate and between the transparent substrate and the first porous semiconductor layer or introducing a post-treatment layer formed directly on a surface of the first or second porous semiconductor layer,
wherein the each thickness of the pre-treatment layer or the post-treatment layer is 0.2 nm to 25 nm.

28. The method of claim 27, further comprising:
depositing a second current collecting electrode on the second porous semiconductor layer.

29. The method of claim 28, further comprising:
forming a third porous semiconductor layer on the second current collecting electrode; and
introducing a third dye sensitizer into the third porous semiconductor layer.

30. The method of claim 27, further comprising:
forming an additional current collecting electrode between the transparent substrate and the first porous semiconductor layer.

31. The method of claim 27, further comprising:
pre-treating the transparent substrate by a method selected from the group consisting of a semiconductor layer material pre-treatment using a semiconductor material precursor solution, a plasma treatment, an ozone treatment, and a chemical treatment.

32. The method of claim 27, further comprising:
post-treating the transparent substrate by a method selected from the group consisting of a semiconductor layer material post-treatment using a semiconductor material precursor solution, a heat treatment, a plasma treatment, an ozone treatment, and a chemical treatment.

33. A dye-sensitized solar cell comprising:
a transparent substrate;
a porous semiconductor layer provided directly on the transparent substrate and comprising a dye sensitizer;
a current collecting electrode provided directly on the porous semiconductor layer and having a structure including at least one through-hole;
a catalyst electrode;
an electrolyte material provided between the transparent substrate and the catalyst electrode; and
a post-treatment layer formed directly on a surface of the porous semiconductor layer,
wherein the post-treatment layer comprises titanium oxide, zinc oxide, tin oxide, niobium oxide, zirconium oxide, cerium oxide, tungsten oxide, silicon oxide, aluminum oxide, nickel oxide, tantalum oxide, barium titanate, strontium titanate, calcium titanate, zinc sulfide, lead sulfide, bismuth sulfide, cadmium sulfide, $CuAlO_2$, $SrCu_2O_2$, or a combination thereof, wherein the thickness of the post-treatment layer is 0.2 nm to 25 nm.

34. The dye-sensitized solar cell of claim 33, further comprising:
a pre-treatment layer formed directly on the transparent substrate and between the transparent substrate and the porous semiconductor layer,
wherein the pre-treatment layer or post-treatment layer comprise titanium oxide, zinc oxide, tin oxide, niobium oxide, zirconium oxide, cerium oxide, tungsten oxide, silicon oxide, aluminum oxide, nickel oxide, tantalum oxide, barium titanate, strontium titanate, calcium titanate, zinc sulfide, lead sulfide, bismuth sulfide, cadmium sulfide, $CuAlO_2$, $SrCu_2O_2$, or a combination thereof,
wherein the thickness of the pre-treatment layer is 0.2 nm to 25 nm.

* * * * *